United States Patent [19]

Brown

[11] Patent Number: 4,800,507
[45] Date of Patent: Jan. 24, 1989

[54] PROVING SAFE OPERATION

[76] Inventor: Christopher R. Brown, 65 New Road, Bromham, Wiltshire, England

[21] Appl. No.: 941,764

[22] Filed: Dec. 15, 1986

[51] Int. Cl.⁴ .............................................. B61L 11/02
[52] U.S. Cl. ........................................ 364/484; 307/3; 330/2; 246/40; 375/10
[58] Field of Search ..................... 364/484, 426; 307/3, 307/9; 375/82, 10; 330/2; 455/67; 246/28 F, 34 CT, 40, 125

[56] References Cited

U.S. PATENT DOCUMENTS 3,710,373  1/1973  Watanabe et al. ...................... 307/3
4,301,404  11/1981  Ley ...................................... 364/484
4,361,904  11/1982  Matsumura ........................... 375/10

Primary Examiner—Emanuel S. Kemeny
Attorney, Agent, or Firm—Beehler, Pavitt, Siegemund, Jagger, Martella & Dawes

[57] ABSTRACT

A method of proving safe operation of a complex electronic circuit, and apparatus for carrying out the method, in which a proving signal having known characteristics is superimposed on an input to the circuit and the output is searched for said characteristics. An example involves the use of a microprocessor arranged to evaluate a fast Fourier transform algorithm on the coded carrier signal of a railway automatic train protection system or of railway a.c. track circuit arrangement.

10 Claims, 3 Drawing Sheets

Fig. 1a INPUT PROVING 3,800,507

PROVING SAFE OPERATION

FIELD OF THE INVENTION

The invention relates to proving safe operation of electronic, particularly solid state electronic circuits.

BACKGROUND OF THE INVENTION

It is an object of this invention to provide a method and apparatus for continuously proving correct operation of such electronic circuits and to ensure failure to safety of electronic circuits and systems in a railway control arrangement whilst avoiding conventional parallel redundancy arrangements.

The invention is particularly useful in systems where a decision concerning safety is based upon the output signal, so that incorrect operation of the signal processing circuits producing that signal can directly affect the safety of the system. For example, a mass transit system, such as an underground railway, having an automatic train protection system in which a coded signal representing safe maximum train speed is transmitted to the train for analysis by the train and comparison with a signal representing the measured speed of the train. If the coded signal is incorrectly decoded or is corrupted before comparison then a wrong decision concerning the maximum speed at which it is safe for the train to travel may be the result.

Also in the railway signalling field, the invention may be useful in coded track circuits in which a coded signal is transmitted between a track circuit transmitter and track circuit receiver via the running rails. When the section of rails, i.e. the track section, is unoccupied the signal reaches the receiver, but when a train is present in the section the rails are electrically shorted together thus preventing propagation of the signal along the section. The present invention may be applied to the receiver apparatus in order to verify its correct operation at all times. A railway track circuit receiver of this type to which the invention may be applied is described in U.S. Pat. No. 4,516,249, assigned to the same assignee as this application.

SUMMARY OF THE INVENTION

According to the invention there is provided a method of proving safe operation of an electronic circuit capable of providing an output signal containing a frequency component corresponding to an input proving signal having a predetermined frequency comprising the steps of generating a proving signal of said predetermined frequency, superimposing said proving signal on the normal input to the electronic circuit, detecting in the output of the electronic circuit a signal having said predetermined frequency, and producing in response to detection of said signal a control signal connected to operate means connected to pass or inhibit the output from the electronic circuit in a sense to pass the output only when and for as long as a signal having said proving signal frequency is indentified in the output.

In one form of the invention the steps of searching for and identifying the proving signal involve sampling the output, digitising the samples and using them as starting level data in the evaluation of a fast or discrete Fourier transform algorithm by means of a digital microprocessor.

Apparatus for carrying out the method of the invention is also provided.

BRIEF DESCRIPTION OF THE DRAWINGS

The invention and how it may be carried into practice will now be described, by way of example only, with reference to the accompanying drawings in which:

FIGS. 1(a) and 1(b) schematically illustrate two alternative arrangements in which safe operation of signal processing circuits is proved by use of a proving signal.

DETAILED DESCRIPTION OF PREFERRED EMBODIMENTS

Figure 1B:
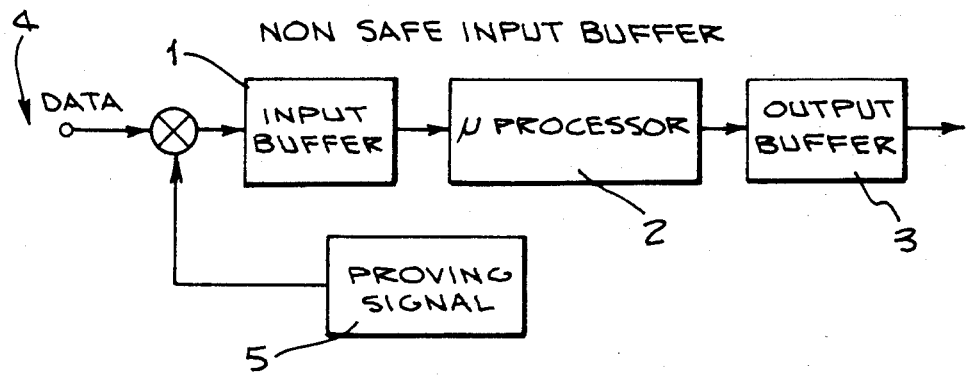

This method is particularly useful for continuously proving the safe operation of electronic circuits which are difficult or too complex to design to possess inherent fail-safe characteristics and where it is wished to avoid the expense, for example, of resorting to parallel redundancy techniques. In railway signalling there are numerous instances where advantage may be derived by adopting microprocessor circuits to perform various signal processing functions, versatility, adaptibility and economy through standarisation to mention just three. In particular, microprocessors because of their speed of operation may carry out several other tasks without incurring real time penalties in connection with the basic function.

However, microprocessors in common with other solid-state electronic circuits are not normally constructed to completely fail safe designs and additional precautions have to be employed where a possible output failure state is potentially unsafe, this is normally referred to as a potential wrong side failure state.

The present method is particularly convenient for, although not exclusively for, proving safe operation of a microprocessor (or like circuit) arranged to carry out a frequency spectrum analysis of the normal input signals. In such circumstances the special search step associated with the proving signal is merged with the processing operation concerning the normal signal, so that the two operations are performed by the safe apparatus. Such an embodiment a this finds application in both railway track circuit receivers, and in automatic train protection system receivers.

The signal search apparatus need not however form part of the main signal path. For instance, in a railway track circuit transmitter, the proving signal search processor forms a circuit branch connected with the transmitter output signal and operates to prove safe operation of the encoding circuit utilising the carrier frequency as the proving signal.

One of the major safety factors of an a.c. track circuit, in which the basic track signal comprises a carrier signal the frequency of which is selected from several alternative frequencies, is correct generation of the carrier frequency. An incorrect frequency could lead to the receiver of an adjacent track circuit being energised and its associated track occupancy relay being picked-up. By designating the carrier signal as the proving signal and checking the transmitter output, not only are the transmitter modulating and encoding circuits proved to be operating correctly but also the carrier signal generator is checked.

Figure 1B:
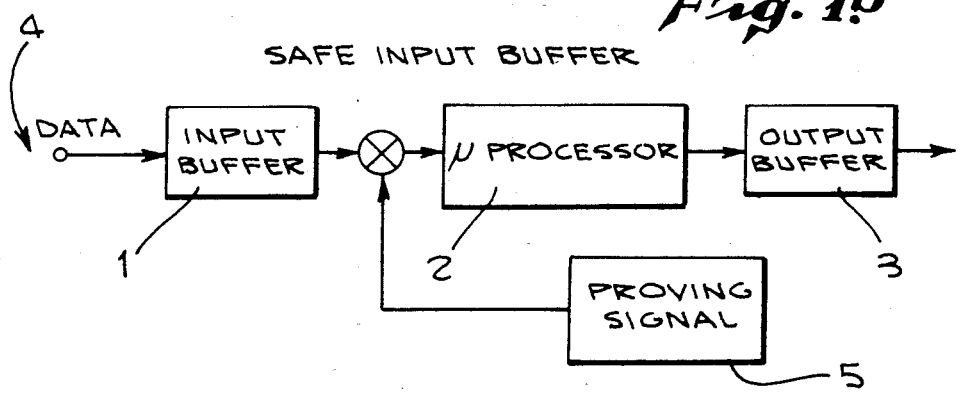

The invention will now be described in further detail by reference to several examples illustrated in the drawings in which:

FIG. 1 (a) shows part of a circuit which used as a receiver for a coded railway track circuit. The receiver is divided into input buffer circuits in block 1, a microprocessor in block 2, and output buffer circuits in block 3. The data input or receiver signal input 4, in a coded track circuit, comprises a carrier signal which is amplitude modulated by a transmitter identifying signal frequency. In the example being described the input buffer 1 contains analogue-to-digital and sample-and-hold circuits constructed using operational-amplifiers and other proprietary integrated circuits which have inherently unpredictable failure modes so that the failed state of any individual component and of the overall circuit cannot be predicted in advance and these are conventionally classified as "non-safe". The microprocessor 2 is programmed to perform a frequency spectrum analysis, e.g. by means of a Fast Fourier Transform upon the data samples produced by the sample-and-hold circuits. The output of microprocessor 2 comprises a multiplicity of calculated signal levels found in each of a the multiplicity of frequency spectrum bandwidth elements comprisng the input signal frequency spectrum. The output buffer 3 may contain circuits responsive to signal levels above a predetermined threshold in predetermined ones of the frequency bins.

A proving signal comprising a signal of fixed frequency and amplitude level is generated by a proving signal generator, indicated at block 5, and superimposed upon the track circuit receiver input or data input 4 in order that it may also be processed by the input buffer 1 and the microprocessor 2. Amongst the circuits receiving the microprocessor output there is now also arranged a circuit responsive to the calculated signal level of the bandwidth element containing the frequency of the proving signal. This is contained within output buffer 3, which circuit is connected to control means (not shown) for inhibiting the output of the microprocessor or suspending operation of the circuit.

In operation of this arrangement the proving signal responsive circuit is arranged to sense the proving signal frequency, and providing a signal of this frequency and having greater than a predetermined threshold amplitude is detected the microprocessor etc. is permitted to continue operation. However, should the amplitude at the proving signal frequency fall below the predetermined threshold the circuit immediately inhibits or suspends operation of the receiver. An output gating arrangement suitable for carrying out this function is described in U.S. Pat. No. 4,672,223.

Referring now to FIG. 1(b) in which like parts have like references the circuits of the input buffer 1 are of fail-safe design, by which it is meant that the failure states of all the circuits included are predictable and are known. Thus, the state which the input to microprocessor block 2 is known and may be arranged to ensure that the consequential output occupies the most safe state. However, the microprocessor itself is still of "non-safe" design and for that reason the proving signal from block 5 is now superimposed upon the input to the microprocessor 2 for processing as before, also the remainder of the circuit arrangement operates as before.

How the proving signal circuits may be realised in practice will now be described in greater detail with reference to FIGS. 2 and 3, in the context of an automatic train protection system similar to that described in the previously mentioned U.S. Pat. No. 4,516,249 to Cook et al.

Figure 2:
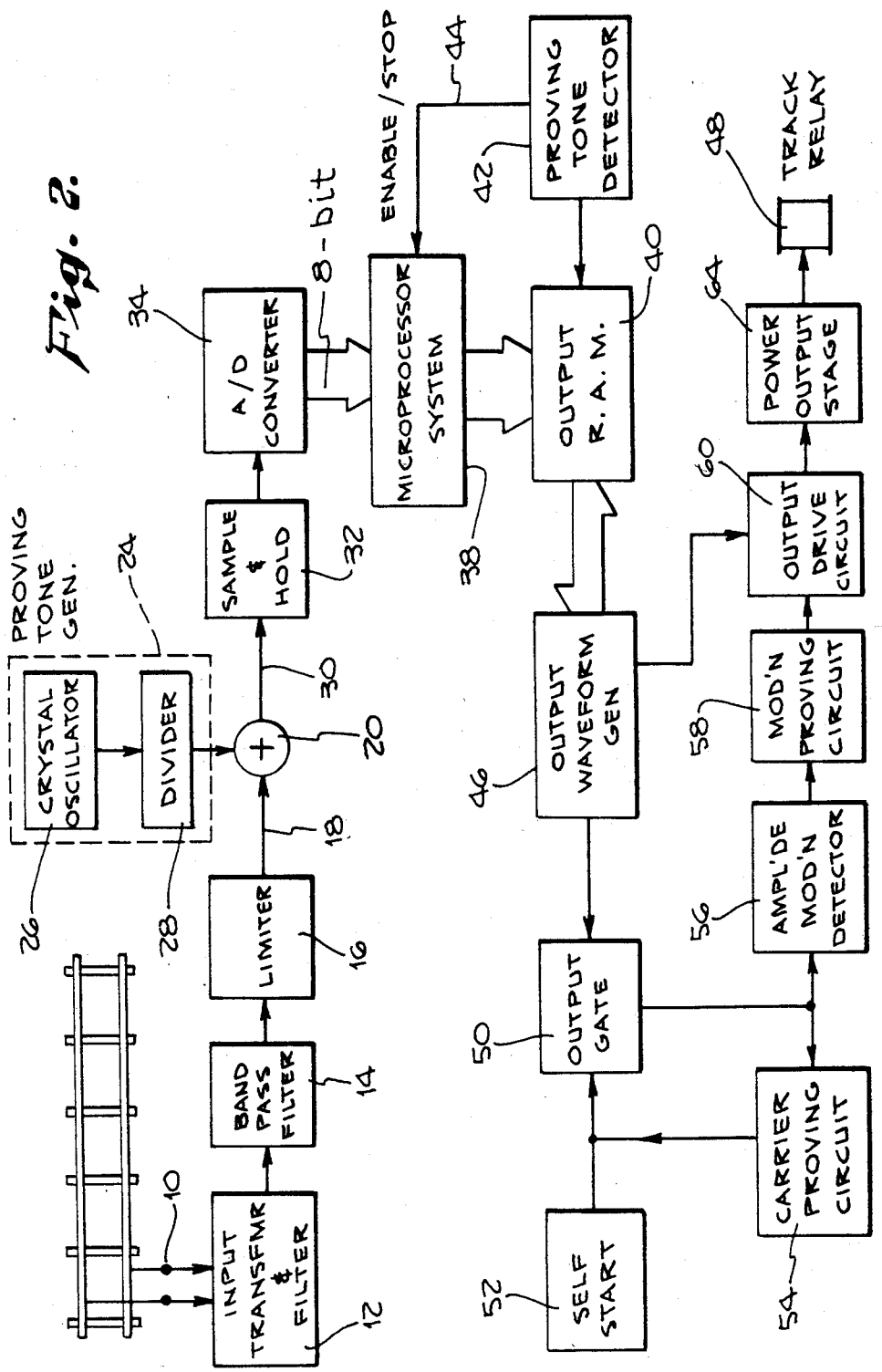
FIG. 2 shows a block diagram of a jointless track circuit receiver employing cyclic redundancy in a microprocessor track signal processing circuit.

An example of one embodiment of the invention is illustrated in FIG. 2 which shows in schematic block diagram form a jointless railway track circuit receiver.

For the purpose of detecting the presence and location of a railway vehicle, railway tracks are divided into sections and a track circuit is constructed to indicate occupancy of a section by connecting a source of current to the rails at one end of the section and some means which is energised by or in response to current from the source is connected to the rails at the opposite end of the section. The simplest form of track circuit uses d.c. current from a battery and a relay. The relay is energised when the section is free, but when the metal wheels and axles of a vehicle short the rails, thus diverting the current from the battery, the relay de-energises and drops-out. Modern railway communication and train control systems need the greater data capacity of a.c. transmission arrangements. Continuous welded truck and a finite number of available track circuit carrier and modulation frequencies mean that interference between sections, not necessarily adjacent, must be guarded against. Also as the track circuit and other systems become more sophisticated ways have to be found to ensure that no equipment failure or transient signal condition can precipitate an unsafe condition.

In the presently described embodiment a complex signal including encoded train speed information is transmitted via the track rails. This signal is received by equipment carried on a train passing through the section and, when the track section is unoccupied, has to be detected and correctly identified in order to "pick-up" a track occupancy relay or an equivalent arrangement.

The track circuit receiver is illustrated schematically in the block diagram of FIG. 2. Input terminals 10 are for connection with the track rails towards one end of a track section to receive a track circuit signal from a co-operating transmitter (not shown). The terminals 10 are connected to opposite ends of a primary winding of a transformer in series with a capacitor, the value of which is, selected to tune the primary winding inductance to a predetermined frequency so as to provide a high-pass filter which blocks input signal frequencies below a predetermined frequency. The input transformer and high-pass filter are generally indicated at block 12. The secondary winding of the input transformer is connected to provide an input to a band-pass filter 14, which is designed to have a band-pass characteristic which prevents so-called "aliasing" of signals in the output samples of the subsequent sampling circuit. When a signal is sampled, prior to digitising, an input signal having a frequency which is a multiple or submultiple of the sampling frequency, generates sample values which could be confused with sample values of harmonics of the signal. By excluding such "alias" harmonics with band-pass filter 14 such ambiguities in the sample data are avoided.

The output of filter 14 is passed through a limiter 16 which provides an output 18 which is sinusoidal, and is limited to a maximum level without distortion. A limiter circuit is necessary because the receiver input signal at terminus 10 can vary greatly subject to, for example, variations of track ballast resistance. This resistance may be low in wet weather tending to reduce the input signal level but, high in dry weather so that the signal level is also higher.

The output 18 is supplied to one input of a summing circuit 20. A second input 22 comprising a "proving tone" signal is provided to the summing circuit 20 from a proving tone generator 24 (enclosed by a dashed line).

The generator 24 comprises a square wave crystal oscillator 26 producing a high frequency square wave output connected to the input of a divider chain 28. The divisor of the chain 28 is selected to provide the required proving tone frequency. This frequency is chosen to be substantially lower than the frequency of the carrier signal in the input 18, as shown in FIG. 3. The output of the divider 28 is passed through a low-pass capacitor/resistor filter network to remove upper harmonics from the proving tone signal before it is connected to the second input 22 of the summing circuit 20.

The output 30 from the summing circuit 20 is fed to a sample and hold circuit 32 which co-operates with an analogue to digital convertor 34 to sample the output 30 at intervals determined by a sample clock signal 36 derived from the clock of a microprocessor system 38. The circuit 32 is a conventional sample and hold circuit having a storage capacitor which is connected to the input 30 during a sampling period to be charged upto the incoming signal level. Under the control of the clock 36 the capacitor is effectively disconnected from the input when a sample is required and the stored voltage level is digitised by the converter 34 and supplied to the microprocessor system 38 as an 8-bit binary word.

The microprocessor system 38 is a single channel Fourier transform processor of the type described in the previously mentioned U.S. Pat. No. 4,516,249 to Cook et al. The system 38 performs a continuous cycle of transform calculations during which a batch of 256 time-domain samples of the input signal 30 are transformed by evaluation of a Fourier transform algorithm into frequency domain samples in 128 discrete frequency bandwith elements each having a linear bandwidth interval of 7.5 hz.

Each of the 128 bandwidth elements has allotted to it a memory location in a random access memory 40 (hereinafter referred to as the output RAM). At the conclusion of each algorithm evaluation cycle the microprocessor system will have written into each of the 128 memory locations in output RAM 40 a hexadecimal number representing the signal power present in each frequency spectrum bandwidth element as calculated in accordance with the samples taken of the input signal 30.

Figure 3:
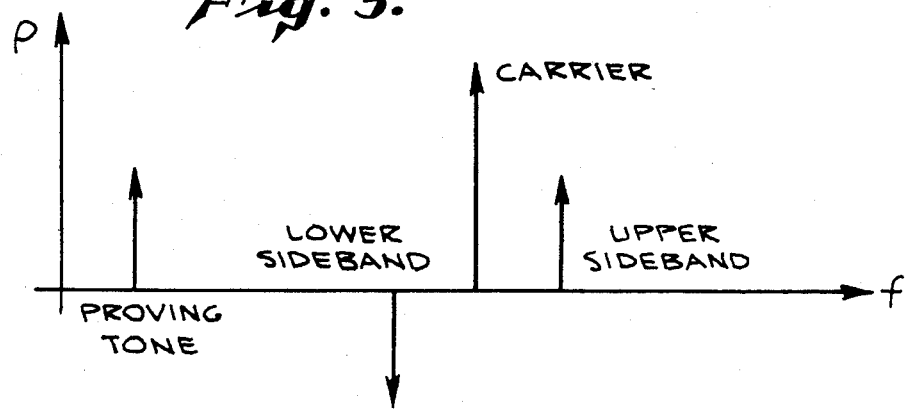
FIG. 3 illustrates the frequency spectrum of a jointless track circuit receiver signal.

FIG. 3 contains a schematic representation of the input signal frequency spectrum which corresponds with the contents of output RAM 30 as signal power against frequency, for an input signal and a proving tone signal. The contents of output RAM 30 is used as the basis for the final output of track circuit receiver and as a continuous monitor of correct operation of the microprocessor system the digital sampling circuits 32 and 34. During correct operation a frequency domain sample corresponding to the proving tone frequency should appear in the calculated results of every transform cycle.

The microprocessor system performs a number of signal tests from the results of which it is determined whether or not the track circuit is occupied or unoccupied and a number of safety tests from which it is determined whether or not the receiver equipment, including the microprocessor system, is working correctly. Briefly, in the signal tests the calculated power levels of the carrier and modulation signals are analysed to determine that the expected carrier signal is present and at a higher power level than a minimum threshold, that a valid modulation frequency is present and has a modulation index within predetermined limits, and that the received waveform is frequency modulated. The track circuit is declared unoccupied only if all the signal tests yield positive results. If one or more of the tests is failed the microprocessor system declares the track circuit to be occupied.

The safety tests are also performed in a continuous cycle, preferably during each transform cycle, using the results calculated in that cycle. The safety tests are preferably carried out before the signal tests. If any one of the safety tests is failed a fault status is declared and the microprocessor system is shut-down or its output inhibited in accordance with system fail-to-safe procedure. The safety tests include checks that software programs sequence correctly, that the signal and safety tests are performed in correct sequence, that memory devices are operating correctly (by checksum techniques), that stored quantities are incorporated (by double storage and comparison techniques), and that the proving tone is represented in the output at a frequency and amplitude between predetermined limits.

The signal tests can only ascertain that the track circuit signal is present or absent in the receiver input signal and therefore whether the track section is unoccupied or occupied, assuming the receiver to be working correctly. If the track circuit carrier signal is not found in the expected memory location in output RAM 40, the track section is assumed to be occupied. However, a circuit fault, for example, a failure of the A/D converter 34 could yield the same result. The proving tone resolves this ambiguity. Because the proving tone signal 22 is injected into the signal path in the receiver equipment its presence in the microprocessor output conclusively proves that the sample and hold circuit 32, the A/D convertor 34, the microprocessor system 38 and all intermediate connections are functioning correctly.

Proving tone detector means 42 is connected with the output RAM 40 and is responsive to the presence of an indication at the correct memory location of a representation of the proving tone signal between predetermined power levels. The detector means 42 is responsive to positive detection of a valid representation to provide an enable/stop feedback 44 to the microprocessor system 38. This feedback connection may operate in one of several ways; for example, it may control operation of a gate to pass or inhibit the microprocessor output in accordance with the enable or pass status of the feedback signal. The feedback connection 44 could also be used to control the microprocessor power supply in the sense to shut-down the supply and halt the microprocessor 38 if a fault condition is detected.

An output waveform generator 46 is provided and includes means for generating a signal to energise a track occupancy relay 48 when the correct track signal carrier is detected in the output of the microprocessor system 38. The generator 46 includes means connected with the output RAM 40 to read the binary number which comprises the contents of the memory location corresponding to the track signal carrier frequency and comparing it with a predetermined minimum number or threshold. Three possible outputs from generator 46 may be provided dependent upon the signal power level represented by the contents of the memory location. When the contents is above a minimum level the track circuit is deemed to be unoccupied, and when the contents of the memory location is below a threshold level the track circuit is deemed to be occupied. These two alternative operational states are represented respectively by an amplitude modulated fixed frequency signal and an unmodulated version of the same frequency signal. Hysteresis effectively provided by a "pick-up" delay and a "drop" delay determined by a whole number of microprocessor system cycles whereby a change of state of the track circuit signal is accepted as a change of state of occupancy only after the new level stored in the memory location has been repeated a predetermined number of successive cycles. The numbers of cycles for each instance may be changed, typically the "pick-up" delay is two cycles and the "drop" delay is one cycle.

If the microprocessor system is shut-down or its output otherwise inhibited this is indicated by a third output at a constant level d.c. voltage. The circuits connected to the output of the generator 46, and which are to be further described below, respond to a dynamic signal put out by generator 40 and they fail-safe otherwise. The modulated dynamic signal indicates an unoccupied track section, the least safe state. The unmodulated dynamic signal indicates an occupied track section, which is a safer state, and is also the indication state assumed in the event of a d.c. output.

A logic type gate 50 is connected to receive the output of generator 46. This gate may comprise a two input NAND gate. The generator output is connected to one input and an enabling signal connected to the other input. The enabling signal is provided either by a self-start circuit 52 or by a frequency detector 54 connected to receive the output of the gate 50 and which is responsive to the basic or carrier frequency provided by the generator 46. This arrangement checks that the generator 46 is operating to provide an output at its preset frequency. An arrangement of this type is described in U.S. Pat. No. 4,672,223 to R. Badge et al.

The signal path from gate 50 containing the dynamic signal passes to a modulation waveform detector circuit 56 which "detects" the amplitude signal. The frequency of the separated modulation signal is checked by a modulation proving circuit 58 comprising a narrow pass-band filtering means connected to the input of an output drive gate 60. The gate 60 is also connected via a signal path 62 to receive a switching waveform corresponding to the original modulation waveform produced by generator 46. Providing the intervening circuits all operate correctly the drive gate 60 is enabled to pass a switching waveform to a power output stage 64.

The output stage 64 comprises a power output transistor, which is operated by the switching waveform, a rectifier and a smoothing circuit. This produces a fully floating, d.c. voltage drive to the track relay 48.

By using a complex waveform to represent an "unoccupied" track section malfunctions and errors in the circuits in the signal path are continuously proved to be working correctly when passing the complex signal because circuit faults will substantially corrupt the waveform. From the output of the modulation proving circuit 58, only the dynamic modulation signal is present in the unoccupied state. In any other state the circuit 58 provides no dynamic output and the output drive gate 60 is not enabled. This latter situation exists in both the occupied of the track section and in the event of a fault developing.

Figure 4:
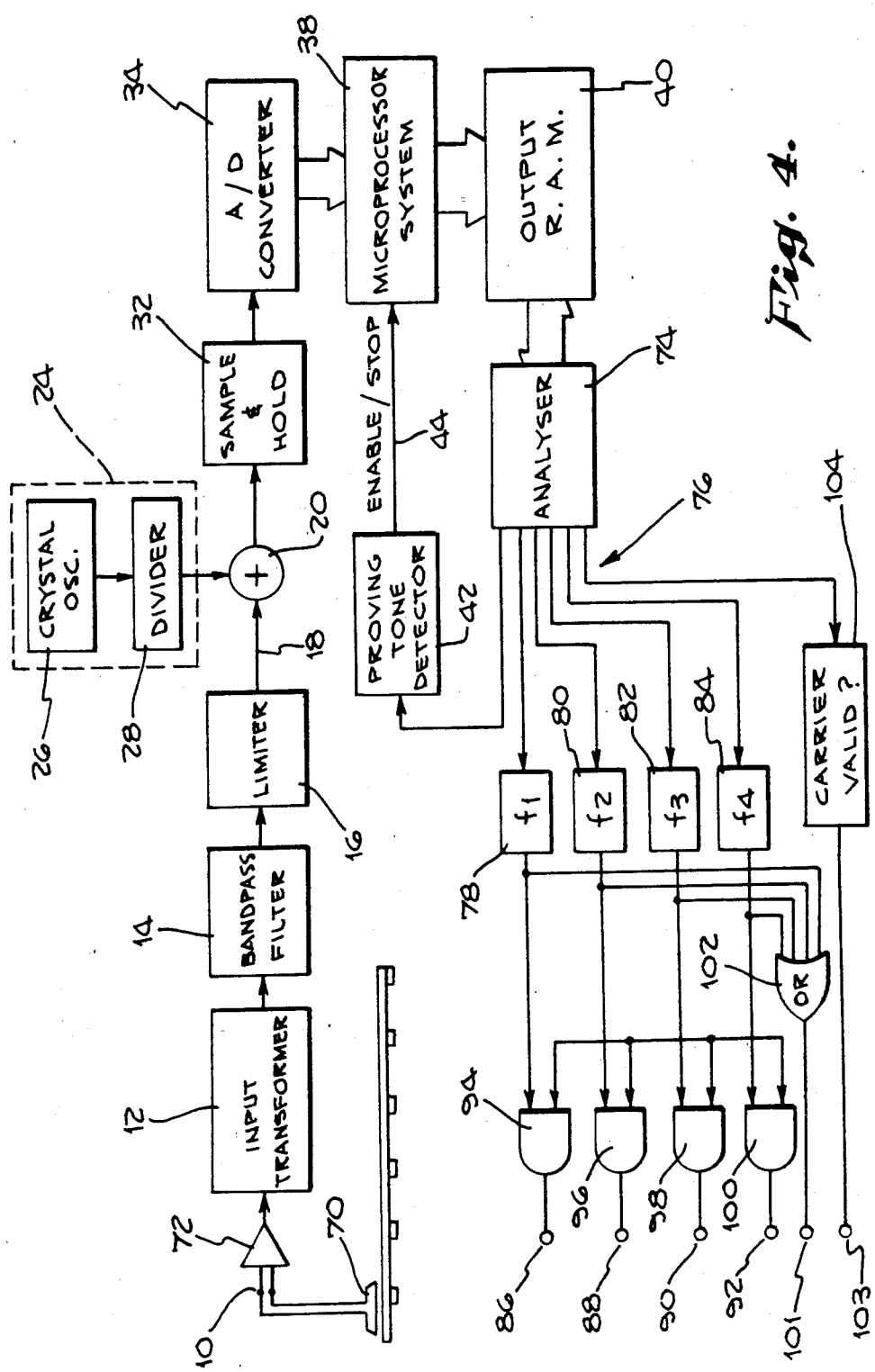
FIG. 4 shows a block diagram of code detection equipment for an automatic train control or train protection equipment.

A further but related embodiment of the invention shown in FIG. 4 is a code detection module. This is an apparatus carried out on a railway train for the purpose of identifying track receiving antenna ahead of the leading axle and coupled in a signal receiving relationship with the track rails. The received signal is fed into a receiver which is very similar to the track circuit receiver describd above an shown in FIG. 2. Reffering to train borne antenna 70 is connected to the input terminals 10 of the receiver input. A pre-amplifier circuit 72 may be used to boost the signal from the antenna. The receiver employs the same input transformer and high pass filter arrangement 12, selective bandpass filter 14, limiter 16, summing circuit 20, sample and hold 32, analogue to digital converter 34, microprocessor system 38 and output RAM 40, as are employed in the track circuit receiver. The same proving tone generator 24, comprising crystal oscillator 26 and divider 28, providing a single constant frequency proving tone is also be employed. The calculated results of the Fourier transform process are written into the output RAM 40, as before.

The track circuit signal comprises a carrier signal frequency modulated by one of a range of fixed code frequencies which represent different maximum train speeds. The purpose of the code detection module is to detect and identify the carrier frequency of a received track signal, to ensure that the carrier signal is valid, and to detect and identify the code modulation signal. The calculated resuls passed to output RAM 40 contain the frequency information. Analysis equipment 74 is connected with RAM 40 to read the stored information for the purpose of checking its validity. This equipment preferably also comprises a microprocessor operated by a suitable software program. This microprocessor 74 may be the same microprocessor 38 which is used to perform the Fourier transformation operated in a time-sharing mode.

The analyser 74 supplies an output to a proving tone detector 42 which again generates the enable/stop signal 44. It also provides a plurality of outputs at 76, one for each of the available code modulation frequencies. Each one of these outputs 76 is connected to a code modulation frequency detector 78, 80, 82 and 84 which is responsive to one of the code modulation frequencies f1, f2, f3 and f4 respectively to provide a speed limit indicating output at 86, 88, 90 and 92. Each of these outputs is passed through an NAND gate 94, 96, 98 and 100 which is enabled by the 101 output of an OR gate 102 connected to receive the outputs of the code detectors 78, 80, 82 and 84. An output 101 is produced if any one of the code detectors provides an output. If none or more than one detector produces an output then the output 101 is removed the gates 94–100 are inhibited.

The outputs 86–92 are interpreted by train control or protection equipment as representing maximum speed limits. The output 101 is interpreted as a caution signal warning that a valid speed limit signal has not been indentified and the train should be halted or driven at a restricted speed only. A further output 103 is also provided to the train control or protection equipment by a carrier proving circuit 104 which is operative to identify the frequency of a received carrier and identify it as one of the possible range of valid carriers.

In operation of this embodiment the track circuit signal is received and a proving time injected, the composite signal is sampled, digitised and transformed as previously described. The frequency domain results stored in output RAM 40 comprising a numerical representation of the frequency spectrum of the received signal is analysed. The results are searched to identify the proving tone and the microprocessor system 38 is permitted to continue producing its outputs as long as the proving tone is found in the results. The remaining outputs which identify the modulation codes and carrier frequencies are inhibited or suppressed by the enable/stop signal 44 in the event that the proving tone is lost, on the ground that the receiver and/or microprocessor is not functioning correctly and, therefore, that these signals are unsafe.

I claim:

1. A method of proving correct operation of an electronic circuit capable of providing an output signal containing a frequency component corresponding to an input proving signal having a predetermined frequency comprising the steps of generating a proving signal of said predetermined frequency, superimposing said proving signal on the normal input to the electronic circuit, detecting in the output of the electronic circuit a signal indicating said predetermined frequency, and producing in response to detection of said signal a control signal connected to operate means connected to pass or inhibit the output from the electronic circuit in a sense to pass the output only when and for as long as a signal having said proving signal frequency is indentified in the output.

2. A method according to claim 1 wherein the superimposed proving signal comprises an alternating signal having characteristics of predetermined frequency and amplitude.

3. A method according to claim 2 wherein the step of detecting the characteristics of the proving signal includes the process of transforming the output signal from the time domain into the frequency domain and detecting the amplitude level of a frequency bandwidth element corresponding to the characteristic frequency.

4. A method according to claim 3 wherein the process of transformation of an output signal includes periodically sampling the output signal to form a finite number of analogue signal samples, digitising said samples and using said samples as starting level data in the evaluation of a fast or discrete Fourier transform algorithm.

5. Apparatus for proving correct operation of an electronic circuit capable of providing an output signal containing a frequency component corresponding to an input proving signal having a predetermined frequency comprising means for generating a proving signal having said predetermined frequency, means connected with the output of the generating means and a normal input of the electronic circuit for superimposing the proving signal on said normal input, detecting means connected with the output of the electronic circuit, said detecting means being responsive to detect in the output of the electronic circuit a signal or representation of said predetermined frequency and being operative to produce a control signal, and means responsive to said control signal to pass the output from the circuit only when and for as long as a signal corresponding to the proving signal frequency is detected in the output.

6. Apparatus according to claim 5 wherein the means for detecting the predetermined frequency of the proving signal is operative to transform the output signal produced by the electronic circuit from the time domain into the frequency domain.

7. Apparatus according to claim 6 wherein the means operative to perform the transform comprises means arranged to evaluate a fast or discrete Fourier transform algorithm.

8. A receiver for a railway track circuit signal including apparatus according to claim 5 comprises a receiver having input coupled to the track rails and via a sample and hold circuit and an analogue to digital converter to the electronic circuit consisting of a microprocessor system programmed to perform a Fourier transformation, storage means for receiving the results of said transformation, proving signal generating means, means connected with the said input for superimposing said proving signal on the normal input signal wherein the detecting means is connected with the storage means to detect in the stored transformation results a representation corresponding to the proving signal and said means is connected to enable or inhibit the microprocessor system whereby to pass an output from the said system only for as long as said proving signal frequency is detected.

9. A receiver according to claim 8 for use as a track circuit signal receiver wherein the input of said receiver is connected to the track rails, said normal input signal comprises a track circuit signal, and means responsive to a microprocessor system output including a representation of the track circuit signal is connected to control energization of a track section occupancy relay.

10. A receiver according to claim 8 for use as track circuit code modulation receiver, the track signal consisting of a carrier signal modulated by one of a range of code signals, wherein the input of said receiver is coupled to the track rails by a receiving antenna, said normal input signal comprises the antenna output, and further means is connected with the microprocessor output storage means to identify the components of the code modulated track circuit signal.

* * * * *